United States Patent [19]
Myer

[11] Patent Number: 5,994,957
[45] Date of Patent: Nov. 30, 1999

[54] FEED FORWARD AMPLIFIER IMPROVEMENT

[75] Inventor: Robert Evan Myer, Denville, N.J.

[73] Assignee: Lucent Technologies Inc., Murray Hill, N.J.

[21] Appl. No.: 08/994,830

[22] Filed: Dec. 19, 1997

[51] Int. Cl.[6] ....................................... H03F 1/32
[52] U.S. Cl. .......................... 330/151; 330/149
[58] Field of Search ................... 330/151, 149, 330/52

[56] References Cited

U.S. PATENT DOCUMENTS

| | | | |
|---|---|---|---|
| 3,471,798 | 10/1969 | Seidel | 330/149 |
| 4,879,519 | 11/1989 | Myer | 330/149 |
| 4,885,551 | 12/1989 | Myer | 330/151 |
| 4,926,134 | 5/1990 | Olver | 330/151 |
| 5,077,532 | 12/1991 | Obermann et al. | 330/151 |
| 5,130,663 | 7/1992 | Tattersall, Jr. | 330/151 |
| 5,304,945 | 4/1994 | Myer | 330/149 |
| 5,774,018 | 6/1998 | Gianfortune et al. | 330/52 |

FOREIGN PATENT DOCUMENTS 0411180  8/1989  European Pat. Off. .

*Primary Examiner*—Robert Pascal
*Assistant Examiner*—Khanh Van Nguyen
*Attorney, Agent, or Firm*—Jimmy Goo

[57] ABSTRACT

The present invention is a feed forward circuit and method for reducing distortion added to an output signal of the feed forward by its amplifiers without increasing the time delay in the main circuit path of the feed forward circuit. This is accomplished using a pre-distortion circuit to introduce a pre-distortion signal to the input signal of a correction amplifier. The pre-distortion signal is being used to cancel a distortion signal that will be introduced by the correction amplifier. The pre-distortion signal has approximately the same frequency and amplitude as the distortion signal. The pre-distortion signal, however, has a phase difference of approximately 180° with respect to the distortion signal such that the pre-distortion signal and the distortion signal cancel each other when combined.

12 Claims, 4 Drawing Sheets

FEED FORWARD AMPLIFIER IMPROVEMENT

FIELD OF THE INVENTION

This invention relates to high power linear amplifiers and more particularly to control systems employing feed forward to reduce distortion of high power linear amplifiers.

BACKGROUND OF THE INVENTION

RF linear amplifiers utilize devices that exhibit non-linear characteristics at higher power levels whereby signal distortion is introduced. For example, if more than one carrier signal is applied to a linear amplifier, its non-linear characteristics cause an unwanted multiplicative interaction of the carrier signals being amplified and the amplifier output contains intermodulation products or distortion. These intermodulation products cause interference which may exceed established transmission standards.

As is well known, intermodulation distortion can be reduced by negative feedback of the distortion components, or by separating the distortion component of the amplifier output and feeding forward the distortion component to cancel the distortion in the amplifier output signal. Of these techniques, the feed forward approach provides the most improvement.

FIG. I is a simplified block diagram of a feed forward circuit 10 disclosed in U.S. Pat. No. 4,885,551. Feed forward circuit 10 receives input signal S having at least one carrier in a prescribed frequency range. Input signal S is split into signals S(12a) and S(12b), wherein signals S(12a) and S(12b) are signals representative of the input signal S. For ease of discussion, numeric references in parenthesis are used herein to indicate from which component(s) a signal was output, and alphanumeric references in parenthesis are used herein to indicate that the component(s) from which the signal was output has more than one output. For example, signal S(12a) would indicate that it was an output signal of splitter 12 and that it was one of a multitude of output signals from splitter 12. If a signal has more than one reference, the order of the references would indicate the path of the signal. For example, signal S(12a,14) would indicate that it was first an output signal of the splitter 12 and then an output signal of an amplifier 14. The output signal of the latter referenced component would be a signal representative of the preceding referenced component, e.g., signal S(12a,14) is a signal representative of the signal S(12a). Signal S(12a) is applied to a first or main circuit path having main amplifier 14 which amplifies signal S(12a) and introduces distortion signal D(14). Thus, main amplifier 14 produces output signal S(14) comprising signals S(12a,14) and D(14). Signal S(14) is applied to directional coupler 18 which directs signals S(18a) and S(18b) to delay 22 and cancellation circuit 20, respectively, wherein signal S(18a) comprises signals S(12a,14,18a) and D(14,18a) and signal S(18b) comprises signals S(12a,14,18b) and D(14,18b). Signal S18(a) is delayed by delay 22 to produce output signal S(22) comprising S(12a,14,18a,22) and D(14,18a, 22).

Signal S(12b) is applied to a second circuit path where it is delayed by delay 16 to produce output signal S(16) comprising signal S(12b,16). Signal S(12b,16) is combined with signal S(18b) in cancellation circuit 20 to form output signal S(20). In cancellation circuit 20, signal S(12a,14,18b) (via signal S(18b)) is canceled by signal S(12b,16). Thus, signal S(20) comprises distortion signal D(14,18b,20). The signal S(20) is applied to correction amplifier 24 which amplifies signal S(20) and introduces distortion signal D(24). Note that distortion signal D(24) is approximately 10,000 times smaller in amplitude than distortion signal D(14). Thus, correction amplifier 24 produces output signal S(24) comprising distortion signals D(14,18b,20,24) and D(24). Signal S(24) is combined with signal S(22) in cancellation circuit 26 to produce output signal S(26). The amplitude of distortion signal D(14,18b,20,24) (via signal S(24)) should be approximately equal to the amplitude of distortion signal D(14,18a,22) (via signal S(22)) such that distortion signals D(14,18b,20,24) and D(14,18a,22) cancel each other in cancellation circuit 26. Thus, signal S(26) comprises S(12a,14,18a,22,26) and D(24,26). In effect, the amplitude of the distortion signal in output signal S(26) is being reduced by substituting a signal representative of distortion signal D(14) (i.e., D(14,18a,22)) with distortion signal D(24), which has a smaller amplitude.

In some instances, the amplitude of distortion signal D(24,26) may produce an unacceptable level of distortion in output signal S(26). To further reduce the amplitude of the distortion signal in output signal S(26), a second feed forward circuit may be incorporated into the first feed forward circuit. FIG. 2 shows a feed forward circuit 28 having the first feed forward circuit 10 and a second feed forward circuit 31 incorporated therein. Second feed forward circuit 31 reduces the distortion signal in output signal S(26) by substituting a signal representative of distortion signal D(24) (i.e., D(24,34a,35)) with a smaller amplitude distortion signal D(40) (produced by amplifier 40 of second feed forward circuit 31). Thus, output signal S(26) of feed forward circuit 28 comprises signal S(12a, 14,18a,22,26) and a signal representative of distortion signal D(40), i.e., D(40,42,26).

Unfortunately, such a feed forward circuit 28 requires increasing the time delay in the main circuit path, which results in greater loss and poorer efficiency due to attenuation. Accordingly, there exists a need for reducing the distortion added to an output signal by a correction amplifier without increasing the time delay in the main circuit path.

SUMMARY OF THE INVENTION

The present invention is a feed forward circuit and method for reducing distortion added to an output signal of the feed forward by its amplifiers without increasing the time delay in the main circuit path of the feed forward circuit. This is accomplished using a pre-distortion circuit to introduce a pre-distortion signal to the input signal of the correction amplifier. The pre-distortion signal is being used to cancel a distortion signal that will be introduced by the correction amplifier. The pre-distortion signal has approximately the same frequency and amplitude as the distortion signal. The pre-distortion signal, however, has a phase difference of approximately 180° with respect to the distortion signal such that the pre-distortion signal and the distortion signal cancel each other when combined.

In one embodiment of the present invention, the feed forward circuit comprises a first or main circuit path and a second circuit path. Input signal S having a carrier signal is introduced to the feed forward circuit and split into signals S(a) and S(b), which are applied to a main amplifier and a first delay, respectively. The main amplifier amplifies signal S(a) and introduces a distortion signal D(main amp). Thus, the main amplifier produces output signal S(main amp) comprising amplified signal S(a) and distortion signal D(main amp). Signal S(main amp) is applied to a second delay and a first cancellation circuit. In the first cancellation circuit, signal S(main amp) is combined with delayed signal S(b) to produce output signal S(cancel) comprising distortion signal D(main amp), wherein amplified signal S(a) is canceled by delayed signal S(b). Signal S(cancel) is then applied to a pre-distortion circuit where a pre-distortion signal D(pre-distort) is introduced. The pre-distortion circuit produces output signal S(pre-distort) comprising distortion signals D(main amp) and D(pre-distort). Signal S(pre-distort) is amplified by a correction amplifier which introduces distortion signal D(correct amp). Distortion signal D(correct amp) has approximately the same frequency and amplitude as pre-distortion signal D(pre-distort), but a phase difference of approximately 180°. When combined in the correction amplifier, distortion signal D(correct amp) and pre-distortion signal D(pre-distort) cancels each other. Thus, the correction amplifier produces output signal S(correct amp) comprising amplified distortion signal D(main amp). Signal S(correct amp) is subsequently combined with delayed signal S(main amp) in a second cancellation circuit, wherein amplified distortion signal D(main amp) via signal S(correct amp) is used to cancel distortion signal D(main amp) via delayed signal S(main amp). The output signal of the cancellation circuit (and the feed forward circuit) comprises amplified signal S(a).

BRIEF DESCRIPTION OF THE DRAWINGS

The features, aspects, and advantages of the present invention will become better understood with regard to the following description, appended claims, and accompanying drawings where:

DETAILED DESCRIPTION

Figure 1:
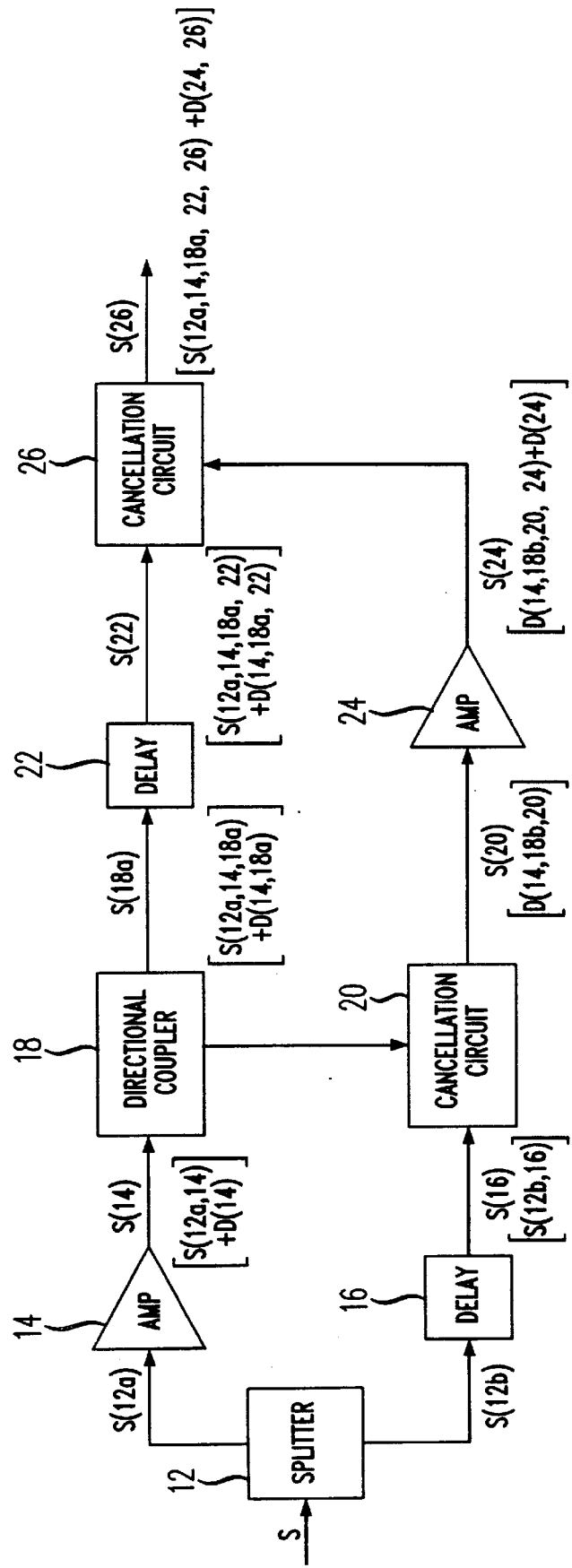
FIG. 1 depicts a block diagram of a feed forward circuit.
Figure 2:
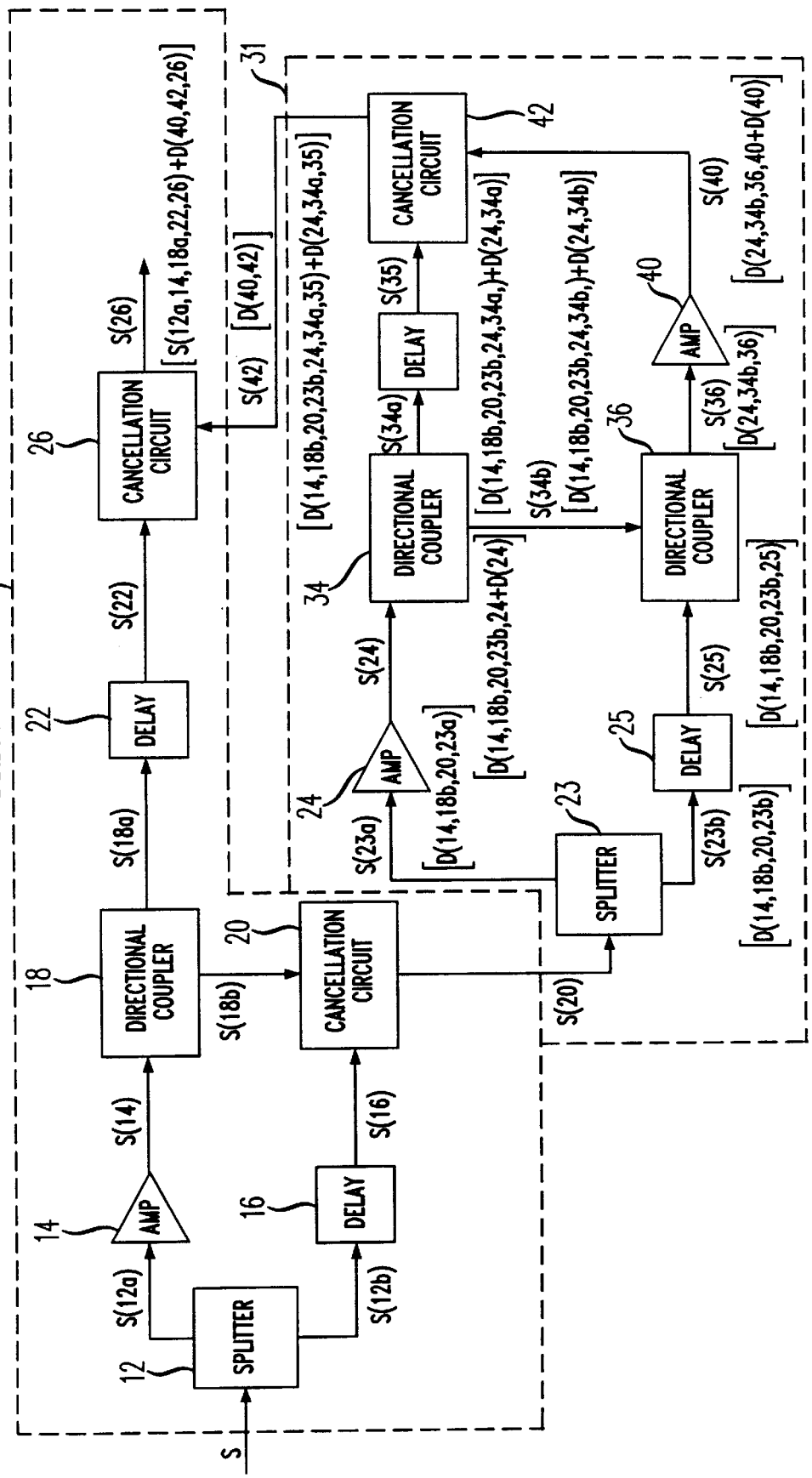
FIG. 2 depicts a block diagram of a circuit having two feed forward circuits.
Figure 3:
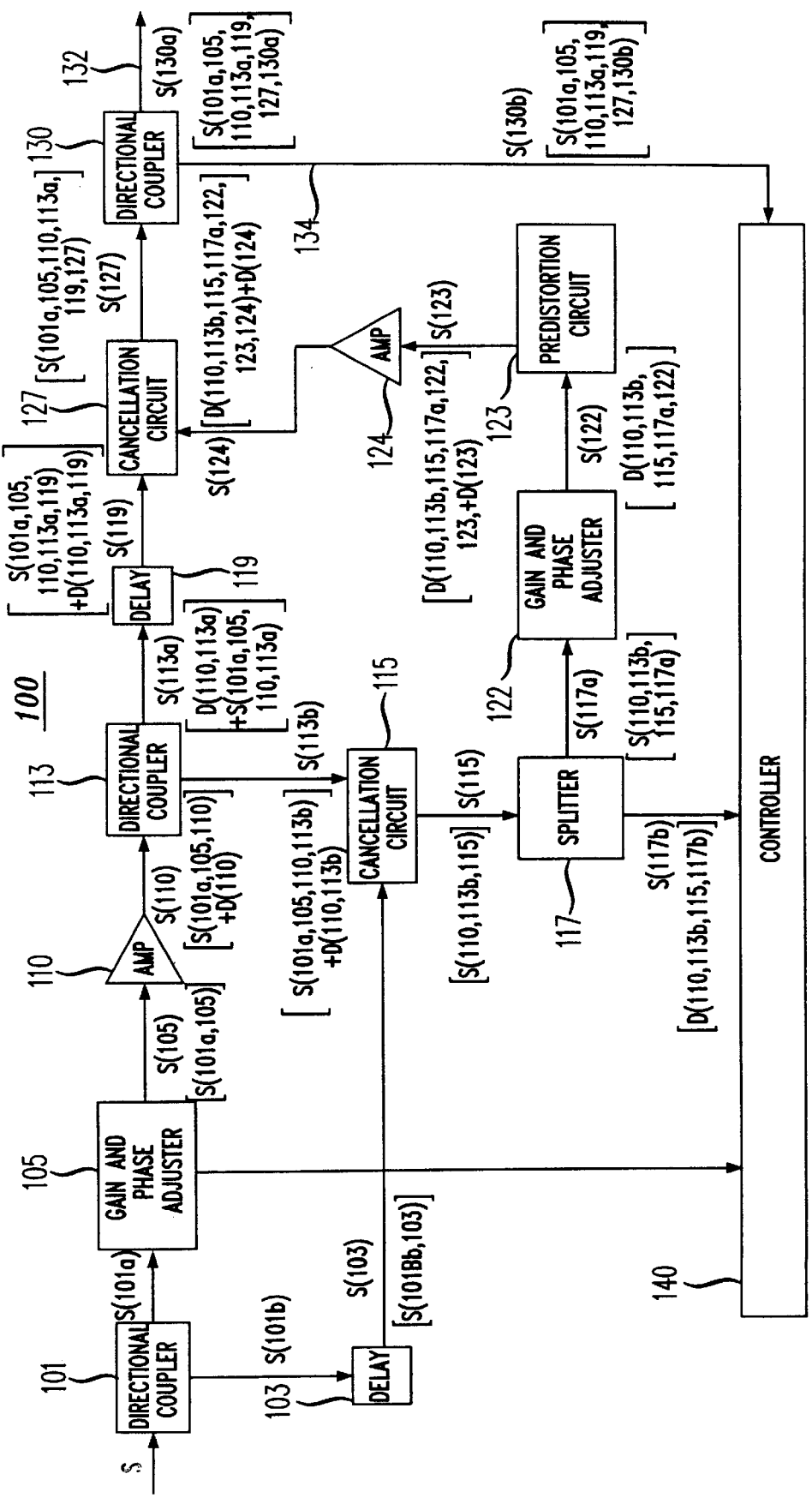
FIG. 3 depicts a block diagram of a feed forward circuit in accordance with the present invention.

FIG. 3 depicts a block diagram of a feed forward circuit 100 operative to amplify signals across a prescribed frequency band in accordance with the present invention. Feed forward circuit 100 has directional coupler 101 that applies composite input signal S to a first circuit path and a second circuit path, wherein input signal S comprises one or more carrier signals $S_c$ across the prescribed band. The first circuit path includes gain and phase adjuster 105, main amplifier 110, directional couplers 113 and 130, cancellation circuit 127, and delay 119. The second circuit path includes delay 103, cancellation circuit 115, splitter 117, gain and phase adjuster 122, pre-distortion circuit 123 and correction amplifier 124. Note that for purposes of this application, the term "splitter" and "directional coupler" shall be construed to be equivalents of each other.

Directional coupler 101 receives input signal S and applies signals S(101a) and S(101b), which are both signals representative of the input signal S, to the first circuit path and the second circuit path, respectively. In the first circuit path, the amplitude and/or phase of signal S(101a) are adjusted in gain and phase amplifier 105 (under the control of controller 140) to produce output signal S(105) comprising signal S(101a,105). Specifically, the gain and/or phase of signal S(101a) are adjusted such that a signal representative of it may be subsequently used to cancel a signal representative of signal S(101b), as will be described herein. Main amplifier 110 amplifies signal S(105) and introduces distortion signal D(110), thus producing output signal S(110) comprising signal S(101a,105,110) and distortion signal D(110).

Directional coupler 113 receives signal S(110) and directs it via signals S(113a) and S(113b) to delay 119 and cancellation circuit 115, respectively, wherein signal S(113a) comprises signal S(101a,105,110,113a) and distortion signal D(110,113a), and S(113b) comprises signal S(101a,105,110,113b) and distortion signal D(110,113b). Delay 119 delays signal S(113a) without distortion for a time delay $T_{119}$ that is set to compensate for the delay of a signal traveling through cancellation circuit 115, splitter 117, gain and phase adjuster 122, pre-distortion circuit 123 and correction amplifier 124. Delay 119 produces output signal S(119) comprising signal S(101a,105,110,113a,119) and distortion signal D(110,113a,119). Cancellation circuit 127 combines signal S(119) with signal S(124) from correction amplifier 124 to produce output signal S(127), as will be described herein. Output signal S(119) is applied to directional coupler 130, which directs it via signals S(130a) and S(130b) to output lead 132 and to controller 140, respectively.

In the second circuit path, delay 103 delays signal S(101b) without distortion for a time delay $T_{103}$, wherein the time delay $T_{103}$ is set to compensate for the delay of a signal traveling through gain and phase adjuster 105, main amplifier 110 and directional coupler 113. Delay 103 produces output signal S(103) comprising signal S(101b,103). Signal S(103) is combined in cancellation circuit 115 with signal S(113b) to produce output signal S(115). If the amplitude and/or phase of signal S(101a) is properly adjusted by gain and phase adjuster 105, signal S(101a,105,110,113b) (via signal S(113b)) is canceled by signal S(101b,103) (via signal S(103)). Thus, signal S(115) substantially comprises distortion signal D(110,113b,115) when signal S(101a,105,110,113b) is canceled by signal S(101b,103). Otherwise, signal S(115) comprises distortion signal D(110,113b,115) and the difference between signals S(101b,103) and S(101a,105,110,113b). For purposes of this application, a signal is deemed canceled if the amplitude of the signal is below an acceptable threshold level.

Signal S(115) is applied to splitter 117, which splits signal S(115) into signals S(117a) and S(117b), wherein signal S(117a) comprises D(110,113b,115,117a) and signal S(117b) comprises D(110,113b,115,117b). Note that cancellation of signals S(101b,103) and S(101a,105,110,113b) is assumed to have occurred in cancellation circuit 115. Signals S(117a) and S(117b) are directed to gain and phase adjuster 122 and controller 140, respectively. The amplitude and/or phase of signal S(117a) is modified in gain and phase adjuster 122 (under the control of controller 140) to produce output signal S(122), which comprises distortion signal D(110,113b,115,117a,122). Specifically, the gain and/or phase of signal S(117a) are adjusted such that a signal representative of it may be subsequently used to cancel distortion signal D(110,113a,119) (via signal S(119)) in cancellation circuit 127.

Signal S(122) is applied to pre-distortion circuit 123, which introduces pre-distortion signal D(123). Thus, pre-distortion circuit 123 produces output signal S(123) comprising distortion signal D(110,113b,115,117a,122,123) and pre-distortion signal D(123). The main objective of pre-distortion circuit 123 is to introduce pre-distortion signal D(123) for canceling distortion signal D(124), which will be produced by correction amplifier 124—that is, the pre-distortion signal D(123) should have the same approximate frequency and amplitude of distortion signal D(124) but with opposite phases (i.e., approximately 180° phase difference).

Correction amplifier 124 amplifies signal S(123) and introduces distortion signal D(124). This distortion signal D(124), however, is canceled in the correction amplifier by the pre-distortion signal D(123) (via signal (123)). Thus, output signal S(124) from correction amplifier 124 substantially comprises distortion signal D(110,113b,115,117a,122, 123,124) when distortion signal D(124) is canceled by pre-distortion signal D(123). Otherwise, signal S(124) comprises distortion signal D(110,113b, 115,117a,122,123,124) and the difference between distortion signals D(123) and D(124).

Signal S(124) is combined with signal S(119) in cancellation circuit 127 to produce output signal S(127). The amplitude and/or phase of signal S(117a) should have been adjusted by gain and phase adjuster 122 such that distortion signal D(110,113b,115,117a,122,123,124) (via signal S(124)) cancels distortion signal D(110,113a,119) (via signal S(119)). Thus, signal S(127) substantially comprises signal S(101a,105,110,113a,119,127) when distortion signal D(110,113b,115,117a,122,123,124) cancels distortion signal D(110,113a,119). Otherwise, signal S(127) comprises signal S(101a,105,110,113a,119,127) and distortion signal D(127), wherein signal D(127) is the difference between distortion signal D(110,113b,115,117a,122,123,124) and distortion signal D(110,113a,119).

Proper adjustment of the amplitude and/or phase of signals S(101a) and S(117a) by gain and phase adjusters 105 and 122, respectively, are controlled by controller 140. Specifically, controller 140 scans signal S(130b) (received from directional coupler 130 via lead 134) for a carrier signal $S_c$. Recall that input signal (and its representative signals) include one or more carrier signals $S_c$. Upon detecting carrier signal $S_c$ in signal S(130b), controller 140 measures the magnitude (e.g., amplitude and phase) of carrier signal $S_c$ in signal S(117b). Controller 140 uses the measured magnitude of carrier signal $S_c$ (in signal S(117b)) to control the manner in which gain and phase adjuster 105 adjusts the amplitude and/or phase of signal S(101a), which includes carrier signal $S_c$. Specifically, the amplitude and/or phase of signal S(101a) are adjusted such that carrier signal $S_c$ via signal S(113b) is canceled by carrier signal $S_c$ via signal S(103) in cancellation circuit 127

After canceling carrier signal $S_c$ in cancellation circuit 127, controller 140 scans signal S(130b) for distortion signal D(127) which, as mentioned earlier, is the difference between distortion signals D(110,113b,115,117a,122,123, 124) and D(110,113a,119). Upon detecting distortion signal D(127), controller 140 measures the magnitude of distortion signal D(127) and causes gain and phase adjuster 122 to adjust the amplitude and/or phase of signal S(117a) such that distortion signal D(110,113b,115,117a,122,123,124) (in signal S(124)) cancels distortion signal D(110,113a,119) (in signal S(119)).

Figure 4:
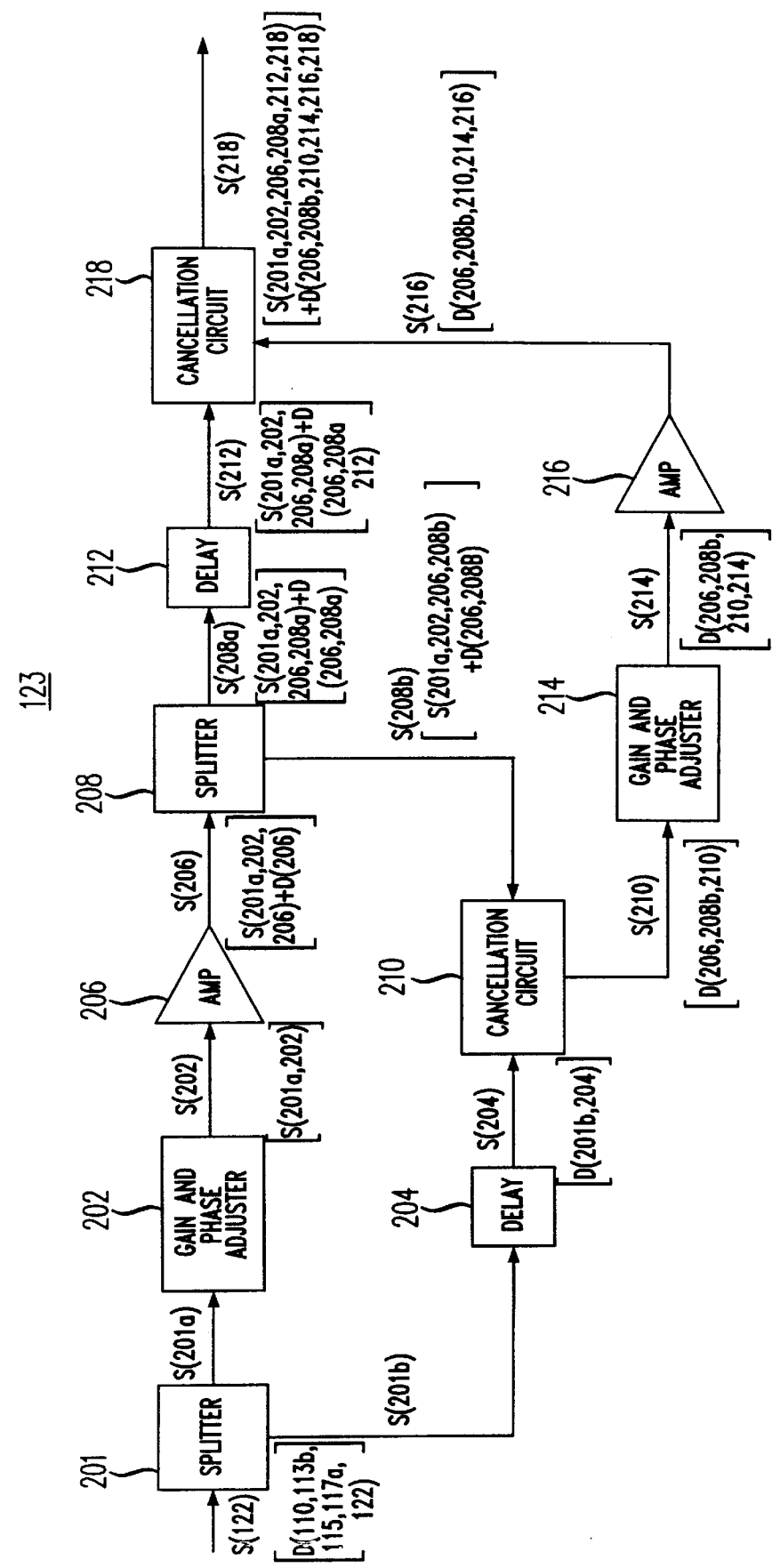
FIG. 4 depicts a block diagram of an example of a pre-distortion circuit.

As mentioned earlier, pre-distortion signal D(123) introduced by pre-distortion circuit 123 should have the same approximate frequency and amplitude as distortion signal D(124), but opposite phases. FIG. 4 illustrates an example of a pre-distortion circuit 123 that may be used in accordance with the present invention. Splitter 201 divides signal S(122) into signals S(201a) and S(201b), wherein signals S(201a) and S(201b) are signals representative of input signal S(122). Signals S(201a) and S(201b) are applied to a first pre-distortion circuit path and a second pre-distortion circuit path, respectively. Recall that signal S(122) comprises distortion signal D(110,113b,115,117a,122). Thus, signal S(201a) comprises D(110,113b,115,117a,122,201a), and signal S(201b) comprises D(110,113b,115,117a,122,201b).

The first pre-distortion circuit path comprises gain and phase adjuster 202 for modifying the amplitude and/or phase of signal S(201a) to produce output signal S(202); amplifier 206 for amplifying signal S(202) and introducing distortion signal D(206) and, thus producing output signal S(206); splitter 208 for splitting signal S(206) into signals S(208a) and S(208b); delay 212 for delaying signal S(208a) for a time delay $T_{212}$ to produce output signal S(212); and cancellation circuit 218 for combining signals S(212) with signal S(216) from the second pre-distortion path to produce output signal S(218), which is the same as signal S(123). The second pre-distortion circuit path comprises delay 204 for delaying signal S(201b) for a time delay $T_{204}$ to produce output signal S(204); cancellation circuit 210 for combining signals S(208b) and S(204) to produce an output signal S(210); gain and phase adjuster 214 for adjusting the amplitude and/or phase of signal S(210) to produce output signal S(214); and amplifier 216 for amplifying the signal S(214) and introducing distortion signal S(216) and, thus producing output signal S(216). Note that the time delay $T_{204}$ of the delay 204 is set to compensate for the delay of a signal traveling through gain and phase adjuster 202, amplifier 206 and splitter 208, whereas the time delay $T_{212}$ of the delay 212 is set to compensate for the delay of a signal traveling through cancellation circuit 210, gain and phase adjuster 214, and amplifier 216.

In the first pre-distortion circuit path, gain and phase adjuster 202 adjusts the amplitude and/or phase of signal S(201a) to produce signal S(202), which comprises signal S(201a,202). Specifically, gain and phase adjuster 202 adjusts signal S(201a) such that a signal representative of it (i.e., signal S(201a,202,206,208b) in signal S(208b)) may be subsequently used to cancel signal S(204) in the cancellation circuit 210. Amplifier 206 amplifies signal S(202) and introduces distortion signal D(206) to produce output signal S(206), which comprises signal S(201a,202,206) and distortion signal D(206). Note that amplifiers 206 and 216 are matched amplifiers, and therefore have substantially identical distortion characteristics. The amplifiers 206 and 216 also have distortion characteristics substantially identical to the distortion characteristic of the correction amplifier 124. In other words, amplifiers 206, 216 and 124 will introduce distortion signals having substantially identical characteristics.

Splitter 208 directs signals S(208a) and S(208b) to delay 212 and cancellation circuit 210, wherein signal S(208a) comprises signals S(201a,202,206,208a) and D(206,208a), and signal S(208b) comprises signals S(201a,202,206,208b) and D(206,208b). Signal S(208b) is combined with signal S(204), which comprises signal S(210b,204), in cancellation circuit 210 to produce output signal S(210). If the amplitude and/or phase of signal S(201a) are properly adjusted by gain and phase adjuster 202, signal S(201a,202,206,208b) (in signal S(208b)) cancels signal S(201b,204) (in signal S(204)). Thus, output signal S(210) substantially comprises signal D(206,208b,210).

In the second pre-distortion circuit, gain and phase adjuster 214 is set to adjust the phase and/or amplitude of signal S(210) to produce output signal S(214), which comprises signal D(206,208b,210,214). Specifically, the phase and amplitude of signal S(210) is adjusted such that it may be used to cancel distortion signals D(216), D(206,208a, 212) and D(124) that have been or will be introduced by amplifiers 216, 206 and 124, respectively. For example, suppose each of the amplifiers 216, 206 and 124 have a one times gain and produces distortion signals of the same approximate frequency, amplitude and phase. Then gain and phase adjuster 214 adjusts the phase of signal S(210) such that there is an 180° phase difference between its output signal S(214) and distortion signals D(216), D(206,208a, 212) and D(124), and adjusts the amplitude of signal S(210) such that its output signal S(214) is equal to the combined amplitudes of distortion signals D(216), D(206,208a,212) and D(124).

Signal S(214) is then applied to amplifier 216 to produce output signal S(216) comprising distortion signal D(206, 208b,210,214,216), which is the difference between distortion signals D(206,208b,210,214) and D(216) (introduced by amplifier 216)—that is, distortion signal D(206,208b, 210,214) over cancels distortion signal D(216). Cancellation circuit 218 combines signals S(216) and S(212) to produce output signal S(123), which comprises signal S(201a,202, 206,208a,212,218) and distortion signal D(206,208b,210, 214,216,218). Signal S(201a,202,206,208a,212,218) being distortion signal D(110,113b,115,117a,122,123), and distortion signal D(206, 208b,210,214,216,218) being distortion signal D(123) which is the difference between distortion signals D(206,208b,210,214,216) and D(206,208a,212).

Although the present invention has been described in considerable detail with reference to certain embodiments, other versions are possible. Therefore, the spirit and scope of the present invention should not be limited to the description of the embodiments contained herein.

We claim:

1. A method for amplifying an input signal S comprising the steps of:

splitting the input signal S into signals S(a) and S(b);

amplifying the signal S(a), thereby producing a signal S(main) including a distortion signal D(main) and an amplified signal S(a);

splitting the signal S(main) into a first signal S(main) and a second signal S(main);

delaying the first signal S(main), thereby producing a delayed first signal S(main);

delaying the signal S(b), thereby producing a delayed signal S(b);

combining the delayed signal S(b) and the second signal S(main), thereby producing a signal S(cancel) including a first signal representative of the distortion signal D(main);

actively generating from the signal S(cancel) including the first signal representative of the distortion signal D(main), a signal S(pre-distort) including a pre-distortion signal D(pre-distort) and including a second signal representative of the distortion signal D(main);

amplifying the signal S(pre-distort), thereby producing a signal S(correct) including an amplified second signal representative of the distortion signal D(main); and combining the signal S(correct) and the delayed first signal S(main), thereby producing a signal S(output) including a signal representative of the amplified signal S(a).

2. The method of claim 1 comprising the additional step of:

adjusting the signal S(a) such that the second signal S(main) cancels the delayed signal S(b) when combined.

3. The method of claim 2, wherein the step of adjusting the signal S(a) includes the step of:

measuring a magnitude of a carrier signal in the signal S(cancel).

4. The method of claim 1 comprising the additional step of:

adjusting the signal S(cancel) such that the signal S(correct) is canceled by the delayed first signal S(main).

5. The method of claim 2, wherein the step of adjusting the signal S(cancel) includes the step of:

measuring a magnitude of a third signal representative of the signal D(main) in the signal S(output).

6. The method of claim 1, wherein the step of actively generating the pre-distortion signal D(pre-distort) further comprises the sub-steps of:

amplifying a first portion of the signal S(cancel), thereby producing a third signal including a distortion portion and an amplified signal;

generating a fourth signal including a signal representative of the distortion portion from a second portion of the signal S(cancel); and combining the fourth signal with the third signal to generate the pre-distortion signal D(pre-distort).

7. The method of claim 1, wherein the second signal representative of the distortion signal D(main) has approximately the same frequency and amplitude as the first signal representative of the distortion signal D(main), and an approximately 180° phase difference.

8. A feed forward circuit comprising:

a first directional coupler for receiving an input signal S and outputting signals S(a) and S(b) using the input signal S;

a main amplifier for amplifying the signal S(a), thereby producing a signal S(main) including distortion signal D(main) and an amplified signal S(a);

a second directional coupler for outputting a first signal S(main) and a second signal S(main) using the signal S(main);

a first delay for delaying the first signal S(main), thereby producing a delayed first signal S(main);

a second delay for delaying the signal S(b), thereby producing a delayed signal S(b);

a first cancellation circuit for combining the delayed signal S(b) and the second signal S(main), thereby producing a signal S(cancel) including a first signal representative of the distortion signal D(main);

a circuit for actively generating, from the signal S(cancel) including the first signal representative of the distortion signal D(main), a signal S(pre-distort) including a pre-distortion signal D(pre-distort) and including a second signal representative of the distortion signal D(main);

a correction amplifier for amplifying the signal S(pre-distort), thereby producing a signal S(correct) including an amplified second signal representative of the distortion signal D(main); and a second cancellation circuit for combining the signal S(correct) and the delayed first signal S(main), thereby producing a signal S(output) having a signal representative of the amplified signal S(a).

9. The feed forward circuit of claim 8 further comprising:

a gain and phase adjuster for modifying the signal S(a) such that the second signal S(main) cancels the delayed signal S(b) when combined.

10. The feed forward circuit of claim 8 further comprising:

a gain and phase adjuster for modifying the signal S(cancel) such that the signal S(correct) is canceled by the delayed first signal S(main).

11. The feed forward circuit of claim 8, wherein the second signal representative of the distortion signal D(main) has approximately the same frequency and amplitude as the first signal representative of the distortion signal D(main), and an approximately 180° phase difference.

12. The feed forward circuit of claim 8, wherein the circuit for actively generating the pre-distortion signal D(pre-distort) further comprises:

a third amplifier for amplifying a first portion of the signal S(cancel), thereby producing a third signal including a distortion portion and an amplified signal;

a signal generating circuit for generating a fourth signal including a signal representative of the distortion portion from a second portion of the signal S(cancel); and a combining circuit for combining the fourth signal with the third signal to generate the pre-distortion signal D(pre-distort).

* * * * *